(12) United States Patent
Tai et al.

(10) Patent No.: US 8,643,094 B2
(45) Date of Patent: Feb. 4, 2014

(54) METHOD OF FORMING A SELF-ALIGNED CONTACT OPENING IN MOSFET

(75) Inventors: Sung-Shan Tai, Hsinchu (TW);
Teng-hao Yeh, Hsinchu (TW); Chia-Hui Chen, Taichung (TW)

(73) Assignee: Sinopower Semiconductor, Inc., Hsinchu (TW)

( * ) Notice: Subject to any disclaimer, the term of this patent is extended or adjusted under 35 U.S.C. 154(b) by 41 days.

(21) Appl. No.: 13/218,476

(22) Filed: Aug. 26, 2011

(65) Prior Publication Data

US 2013/0049104 A1    Feb. 28, 2013

(51) Int. Cl.
*H01L 29/78*    (2006.01)

(52) U.S. Cl.
USPC ........... 257/330; 438/702; 438/270; 438/259; 438/212; 438/206

(58) Field of Classification Search
USPC ............. 257/330, E21.241, E21.41, E29.262, 257/E29.257, E29.201, E29.26
See application file for complete search history.

(56) References Cited

U.S. PATENT DOCUMENTS

| 6,346,468 | B1 * | 2/2002 | Pradeep et al. | 438/595 |
| 2004/0124461 | A1 * | 7/2004 | Gajda | 257/330 |
| 2010/0320533 | A1 * | 12/2010 | Inagawa et al. | 257/332 |

* cited by examiner

*Primary Examiner* — Benjamin Sandvik
*Assistant Examiner* — Rodolfo Fortich
(74) *Attorney, Agent, or Firm* — Litron Patent & Trademark Office; Min-Lee Teng

(57) ABSTRACT

A method of forming a contact opening in a semiconductor substrate is presented. A plurality of trench gates each having a projecting portion are formed in a semiconductor substrate, and a stop layer is deposited over the semiconductor substrate extending over the projecting portions, wherein each portion of the stop layer along each of the sidewalls of the projecting portions is covered by a spacer. By removing the portions of the stop layer not covered by the spacers by utilizing a relatively higher etching selectivity of the stop layer to the spacers, the openings between adjacent projecting portions with an L-type shape on each sidewall can be formed, and a lithography process can be performed to form self-aligned contact openings thereafter.

11 Claims, 20 Drawing Sheets

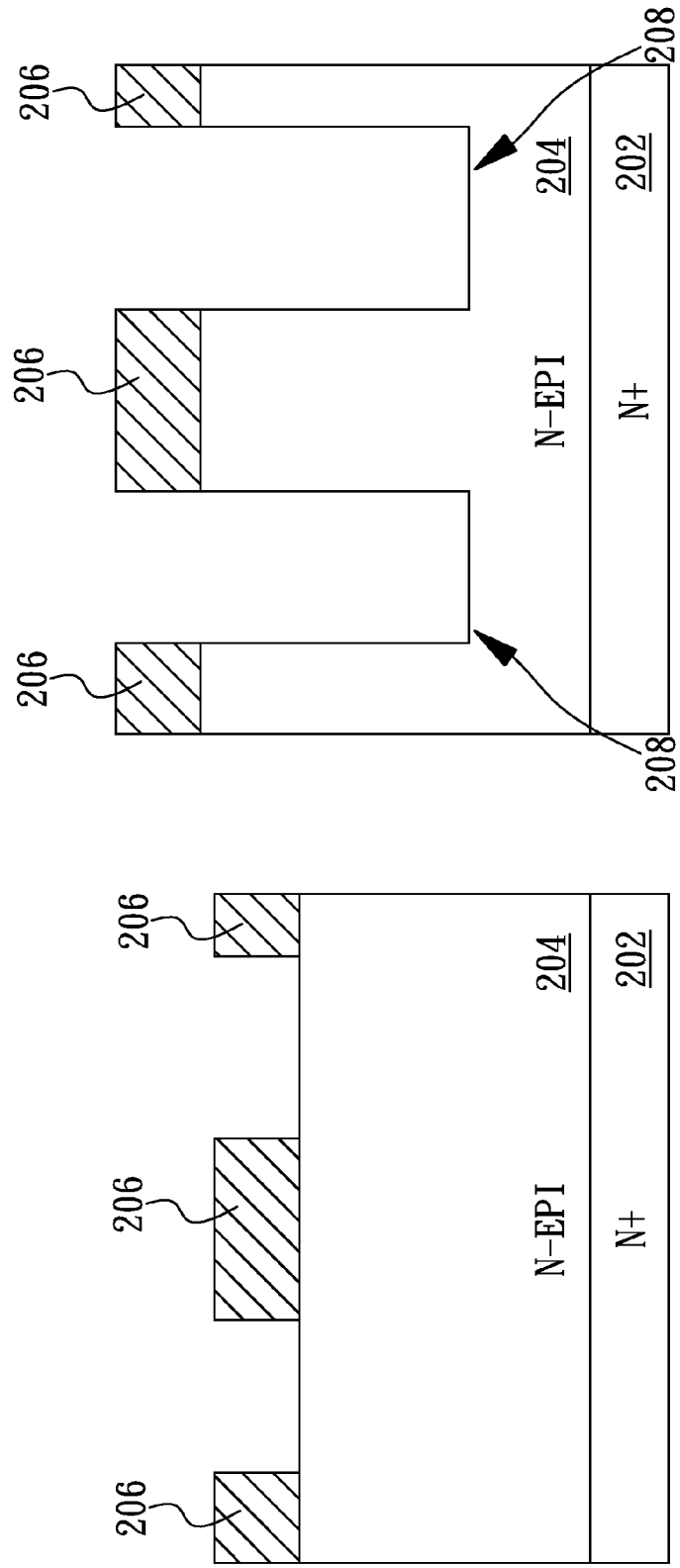

METHOD OF FORMING A SELF-ALIGNED CONTACT OPENING IN MOSFET

FIELD OF THE INVENTION

The present invention relates to semiconductor MOSFET technology, and in particular, to a trench MOSFET having self-aligned features.

BACKGROUND OF THE INVENTION

Power MOSFETs (metal oxide semiconductor field effect transistors) are well known in the semiconductor industry. One variety of power MOSFETs is the vertically-conducting trench MOSFET. A cross-section view of such a MOSFET is shown in FIG. 1, wherein MOSFET 100 has trenches 106 each including a poly-silicon gate 108 insulated from body regions 110 by a gate dielectric 112; source regions 114 flank each side of the trenches 106; dielectric layer 116 insulates the gates 108 from an overlay metal layer 118; and substrate region 102 forms the drain of MOSFET 100.

When MOSFET 100 is in the on state, current flows vertically between the source regions 114 and the substrate 102; and the current is a function of the drain to source resistance ($Rds_{on}$). To improve the current capability of the MOSFET, it is very effective to reduce the $Rds_{on}$. One way to reduce the $Rds_{on}$ of the trench MOSFET is to increase the trench density (i.e., to increase the number of trenches per unit area), and this can be achieved by reducing the cell pitch. However, reducing the cell pitch of MOSFETs is limited not only by the MOSFET cell structure but also the specific process to fabricate the MOSFET. Furthermore, reducing the cell pitch is made further difficult by the limitations of the manufacturing process technology such as the minimum critical dimensions that the lithography tools can achieve, the minimum required spacing between different cell regions as dictated by the design rules, and the misalignment tolerances.

The different dimensions that determine the minimum cell pitch for trench MOSFET 100 are shown in FIG. 1. Dimension A is the minimum trench width that the lithography tools can achieve, dimension B is the minimum contact opening that the lithography tools can achieve, dimension C is the minimum trench-to-contact spacing dictated by the design rules, and dimension D is the contact registration error tolerance or contact misalignment tolerance. The minimum cell pitch for MOSFET 100 thus equals A+B+2C+2D. Reducing any of these dimensions without complicating the process technology is difficult to achieve.

As MOSFET shrinks smaller and smaller, a small misalignment will cause a large variation of trench-to-contact spacing variation, and it will affect the device parameters dramatically. Moreover, to make the threshold voltage of MOSFET easy for modeling, smaller contact opening dimension, which affects the threshold voltage significantly, is required. By shrinking the contact opening dimension, parasitic capacitance can be reduced, and the threshold voltage will be controlled more precisely as well.

The document U.S. Pat. No. 7,344,943 disclosed a method using an exposed edge of an insulating layer in each trench to define a portion of each contact opening between every two adjacent trenches.

The document U.S. Pat. No. 7,375,029 disclosed a method fabricating contact openings in mesa regions of a semiconductor body.

The document U.S. Pat. No. 6,277,695 disclosed a method to form a self-aligned contact opening in a vertical planar DMOSFET (double-diffused MOSFET) by forming spacers on the sides of a gate section.

Although the documents described above have raised different methods to form a self-aligned contact opening, they are only suitable for either the gate is underneath the top surface of the substrate or the gate is above the top surface of the substrate. Moreover, they are still insufficient to control the contact opening dimension very precisely. Therefore, there is a need for a contact opening process no matter whether the gate is underneath the top surface of the substrate or the gate is above the top surface of the substrate to reduce the cell pitch, moreover, the contact opening dimension and the contact misalignment tolerance of trench MOSFET can be precisely controlled without increasing the process complexity.

SUMMARY OF THE INVENTION

An object of this invention is to provide a method to form a self-aligned contact opening, which reduces the contact opening dimension and the contact misalignment; it also makes the contact opening dimension much easier for controlling, and it can reduce the cell pitch without increasing the process complexity.

The present invention discloses a method of forming a contact opening in a semiconductor substrate which has a first projecting portion and a second projecting portion with a height relative to the semiconductor substrate. At first, a stop layer is formed over the semiconductor substrate extending over the two projecting portions. After that, a first spacer and a second spacer are formed along the sidewalls of the projection portions, and then remove the portions of the stop layer which are not covered by the spacers, by utilizing a relatively higher etching selectivity of the stop layer to the spacers, to form an opening between the two projecting portions. After that, a lithography process can be used to make a contact opening.

In one embodiment, a plurality of trench gates are formed in a semiconductor substrate, wherein each trench gate comprises a gate electrode projecting over the top surface of the semiconductor substrate to form a projecting portion with a height relative to the semiconductor substrate, and each projecting portion comprises a thin oxide layer, but it is not necessary, and a SiN (silicon nitride) layer is formed over the semiconductor substrate and extended over the projecting portions. After that, a spacer is formed along each of the sidewalls of the projecting portions, and the portions of the stop layer which are not covered by the spacers are removed, by utilizing a relatively higher etching selectivity of the stop layer to the spacers, to form first openings between adjacent projecting portions and an L-type shape on each sidewall. Next, a dielectric layer is then formed over the entire substrate, and then a lithography process can be performed to remove the predefined portions of the dielectric layer and the spacers, by utilizing a relatively higher etching selectivity of the dielectric layer and the spacers to the L-type shapes, to form contact openings, which are self-aligned to adjacent projecting portions.

In another embodiment, the gate electrode of each trench gate is underneath the top surface of the semiconductor substrate and covered by a dielectric oxide projecting over the top surface of the semiconductor substrate, wherein the dielectric oxide forms a projecting portion with a height relative to the semiconductor substrate, and then contact openings are formed between adjacent projecting portions by the steps similar to foregoing first embodiment.

By using the method disclosed in this invention, the contact opening dimension will be shrunk to reduce the parasitic capacitance effects. By controlling the thickness of the stop layer, the threshold voltage of the electrodes associated with the contact openings can be accurately controlled and the trench-to-contact spacing will be maintained precisely. Moreover, this invention helps eliminate the 2D term of the cell pitch of the MOSFET 100 (FIG. 1) and reduce the dimension B so as to obtain a reduced cell pitch without introducing any process complexities.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein:

FIGS. 2B-2J show cross-section views at different stages of manufacturing a trench MOSFET in accordance with one embodiment of the present invention.

DETAILED DESCRIPTION OF THE INVENTION

The detailed explanation of the present invention is described as following. The described preferred embodiments are presented for purposes of illustrations and descriptions, and they are not intended to limit the scope of the present invention.

One embodiment of the present invention is a method to form an opening on a semiconductor substrate having two projecting portions, which can be applied to the process of manufacturing many different semiconductor device or structure such as, but is not limited to, a MOSFET device for forming a contact opening in the MOSFET.

Figure 2A:
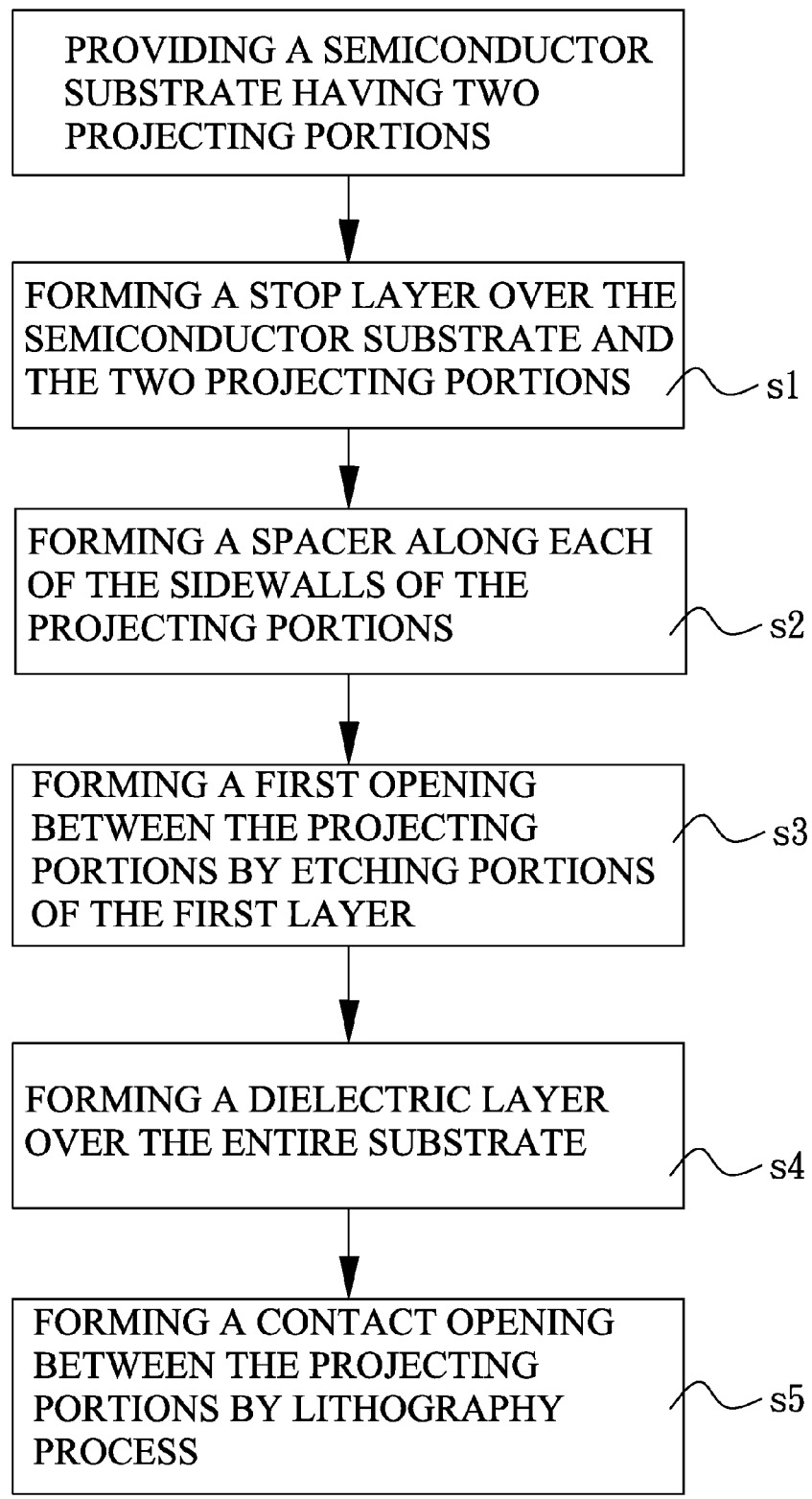
FIG. 2A is a flow chart describing the steps of forming a self-aligned contact opening according to the present invention.

In one embodiment, the method of forming a self-aligned contact opening in a semiconductor substrate having two projecting portions according to the present invention comprises the following steps as shown in FIG. 2A. In step s1, form a stop layer over the semiconductor substrate extending over the two projecting portions. In step s2, form a spacer along each of the sidewalls of the projection portions as shown in FIG. 2F. In step s3, remove the portions of the stop layer which are not covered by the spacers, by utilizing a relatively higher etching selectivity of the stop layer to the spacers, to form a first opening between the two projecting portions as shown in FIG. 2G In step s4, form a dielectric layer over the entire substrate as shown in FIG. 2H. In step s5, form a contact opening between the two projecting portions by performing a lithography process to remove the predefined portions of the dielectric layer and the spacers by utilizing a relatively higher etching selectivity of the dielectric layer and the spacers to the stop layer as shown in FIG. 2I; therefore, the contact opening will be self-aligned to the adjacent two projecting portions.

FIGS. 2B-2J are cross-section views at different stages of manufacturing a trench MOSFET in accordance with an embodiment of the present invention. FIG. 2B shows a semiconductor substrate comprising a light doped n-type epitaxial layer 204 extending over a highly doped n-type silicon layer 202. A layer of a material which is resistant to silicon etching is formed over the epitaxial layer 204, wherein the layer can be, but is not limited to, an oxide layer, a $SiO_2/SiN/SiO_2$ composition layer or a $SiN/SiO_2$ composition layer. By performing a lithography process, the predefined portions of the layer which is resistant to silicon etching are removed so as to leave the other portions remained as shown in hard mask regions 206. In one embodiment in which an oxide layer is used, conventional dry etching or wet etching can be used to remove the predefined portions of the oxide layer.

In FIG. 2C, a silicon etching is carried out to form a plurality of trenches 208 in the epitaxial layer 204. The spacing between any two adjacent hard mask regions 206 defines the width of each trench 208. Conventional methods for etching silicon, such as reactive ion etching (RIE), can be used to form the plurality of trenches 208.

Figure 2D:
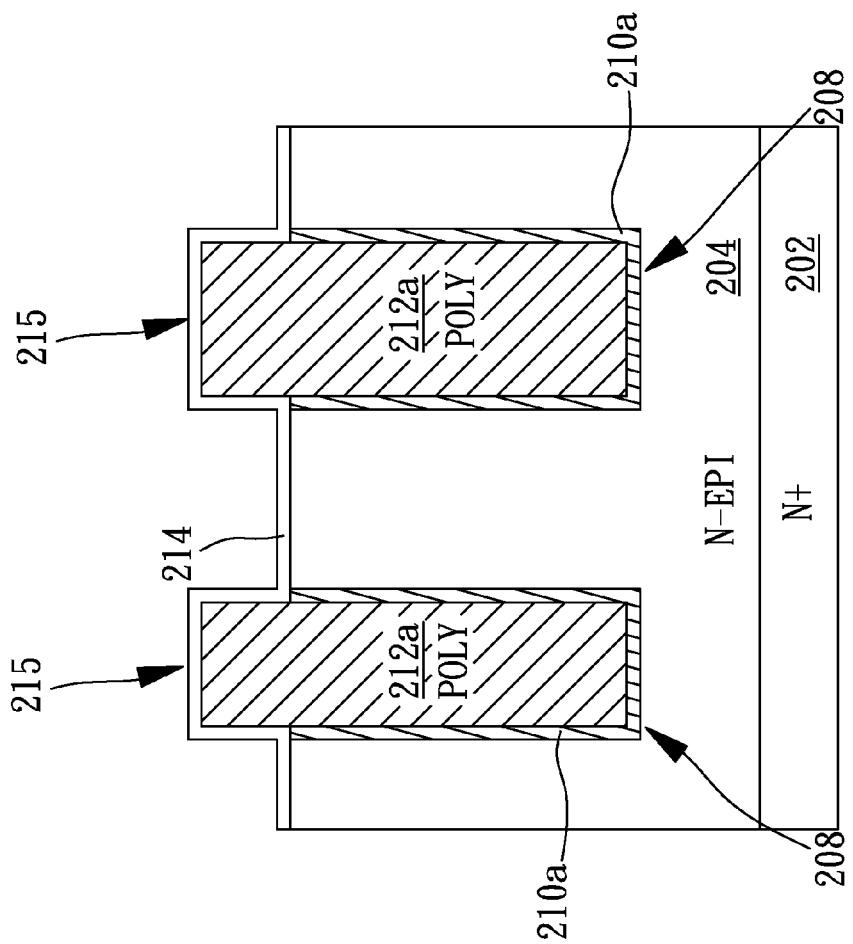

In FIG. 2D, a gate dielectric 210a along the inner surface of each trench 208 and a gate electrode 212a projecting over the top surface of the semiconductor substrate are formed in each trench 208 by using conventional methods, and then the hard mask regions 206 are removed. In one embodiment, the gate electrode 212a is made of poly-silicon. Then, an insulating layer 214 is formed over the epitaxial layer 204 and extended over the exposed portions of the gate electrodes 212a, wherein each gate electrode 212a which is covered by the insulating layer 214 and its corresponding gate dielectric 210a form a trench gate in each trench 208, in which the exposed portion of each gate electrode 212a which is covered by the insulating layer 214 thus forms a projecting portion 215 of each trench gate. In one embodiment, the insulating layer 214 can be formed by depositing a dielectric material such as an oxide layer.

Figure 2E:
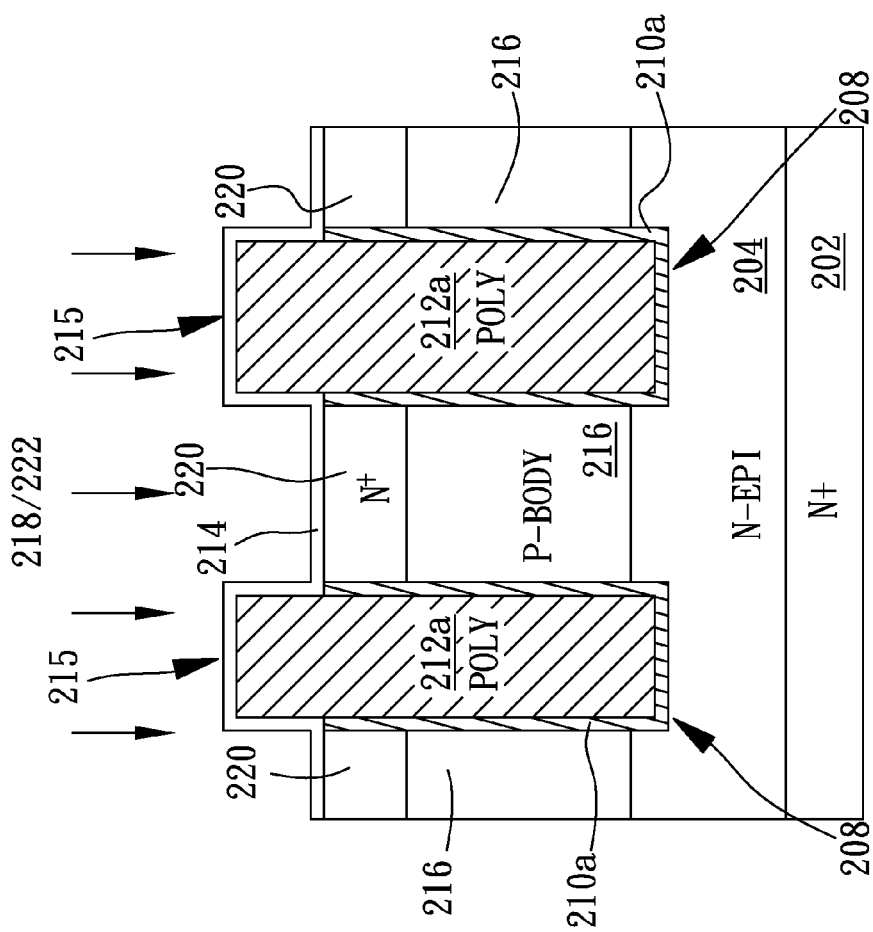
Figure 2F:
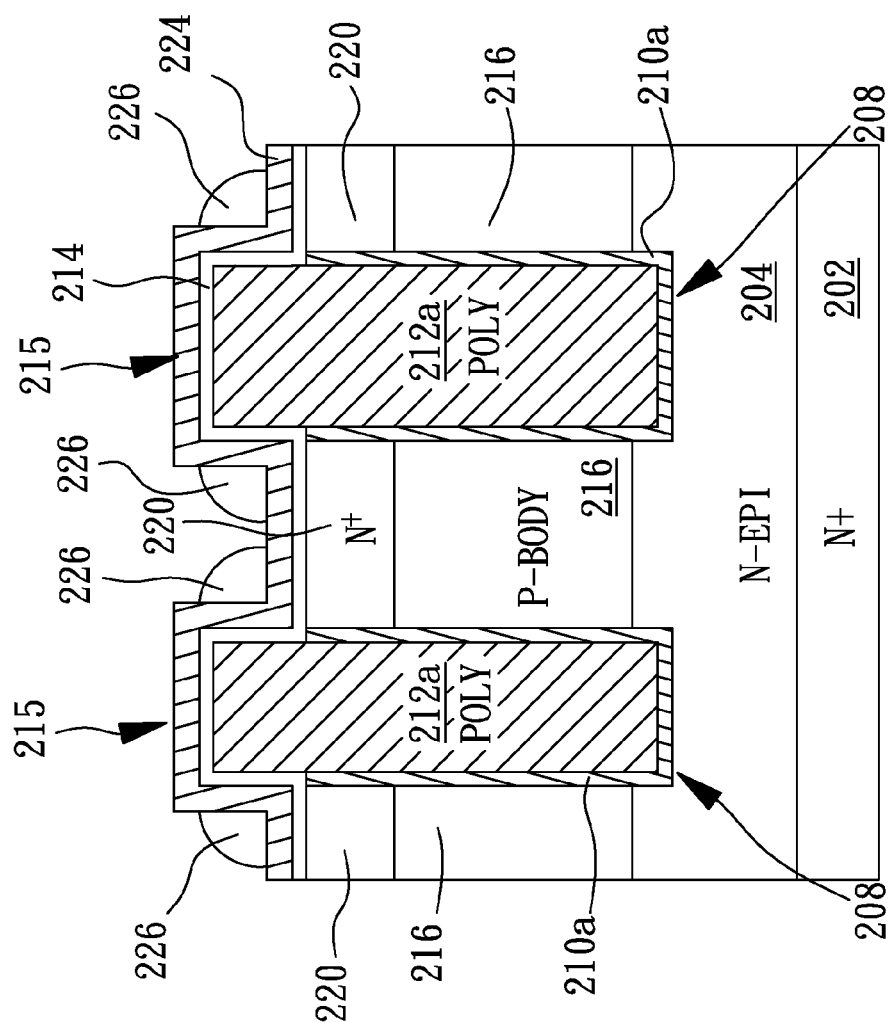
Figure 2G:
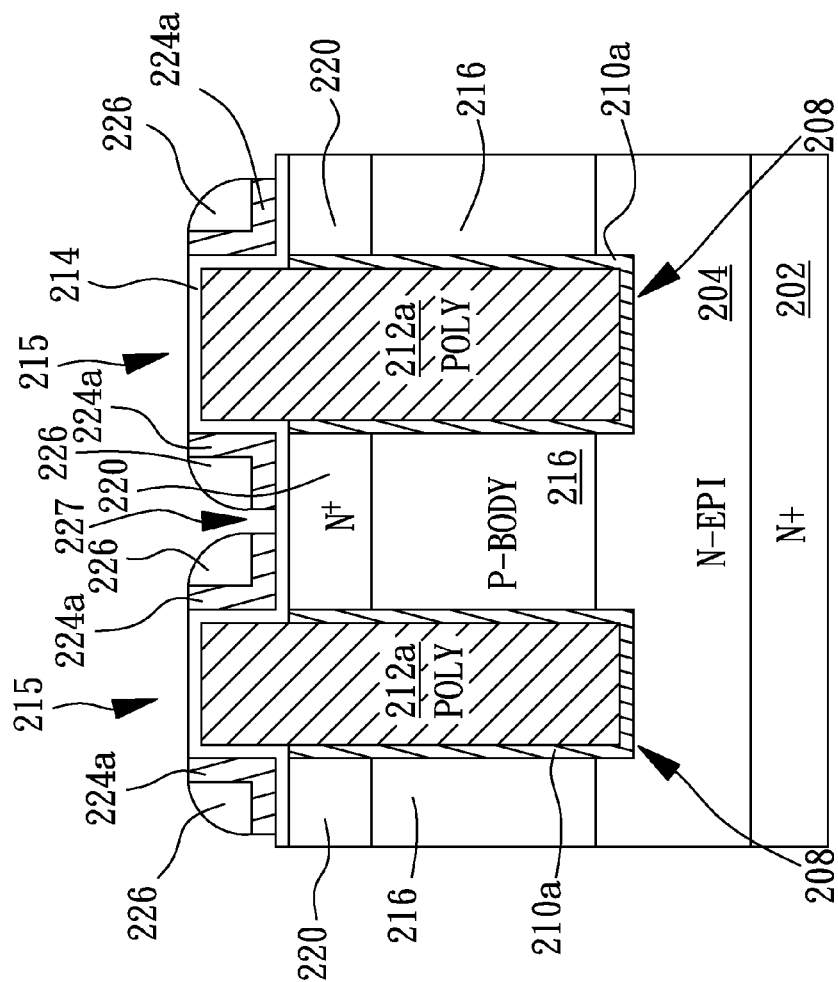
Figure 2H:
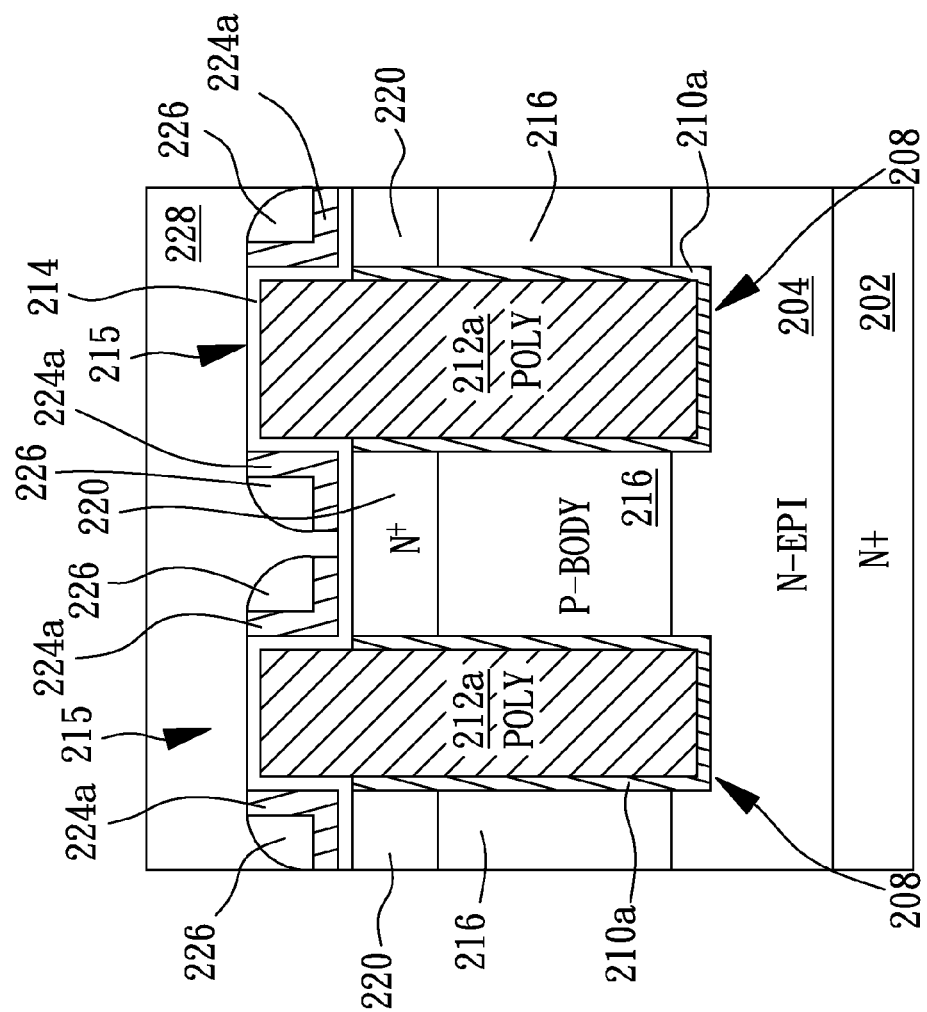
Figure 2I:
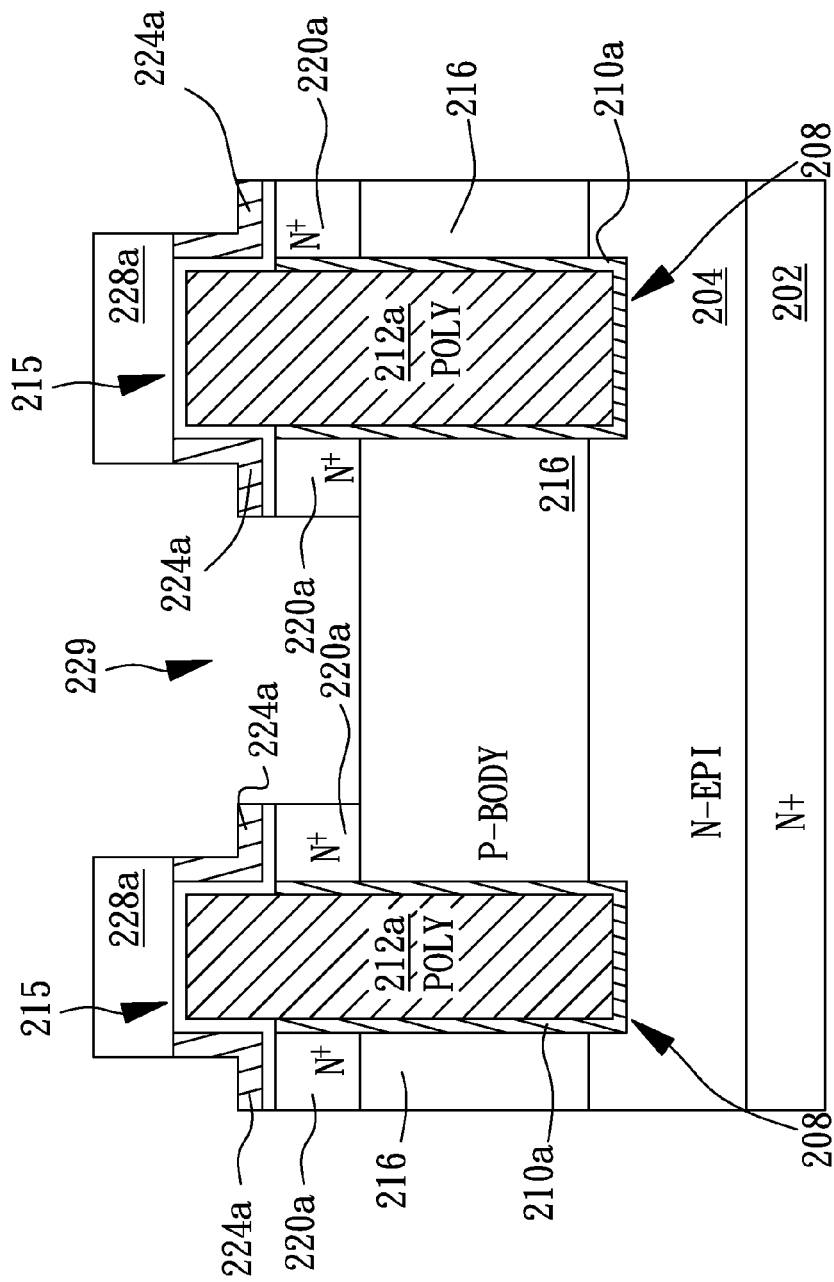

In FIG. 2E, p-type body regions 216 are formed in the epitaxial layer 204 between adjacent trenches 208 by implanting p-type impurities, such as boron, wherein the body regions 216 extend into the epitaxial layer 204 to a depth primarily dictated by the target channel length, and the p-type implanting is symbolically shown by arrows 218. Afterward, highly-doped n-type source regions 220 are formed in the body regions 216 by implanting n-type impurities such as arsenic or phosphorous, and the highly doped n-type silicon layer 202 is the drain region of the trench MOSFET, wherein the source regions 220 extend along the top surface of the body regions 216 and below the insulating layer 214, and the n-type implanting is symbolically shown by arrows 222. Conventional ion implantation techniques can be used for both implanting steps.

In FIG. 2F, a stop layer, such as a thin SiN (silicon nitride) layer 224, is formed over the insulating layer 214 by using conventional methods, for example, conventional deposition techniques. After that, a spacer 226 is formed along each of the sidewalls of the projecting portions 215. In one embodiment, the spacers 226 are formed by depositing an oxide layer over the entire SiN layer first, and then the oxide layer is etched with a vertical etching, which can be achieved by conventional dry etching method such as reactive ion etching (RIE), so as to leave the spacers 226, wherein the thickness of the spacers can be controlled by a conventional method. Subsequently, the portions of the SiN layer 224 which are not covered by the spacers 226 are removed by utilizing a relatively higher etching selectivity of the SiN layer 224 to the spacers 226, which means the SiN layer 224 having a relatively higher etching rate than the spacers 226, and therefore the SiN layer 224 is easier to be etched than the spacers 226; and the left portions of the SiN layer 224 which are covered by the spacers 226 thus form an L-type shape 224a along each of the sidewalls of the projecting portions 215 as shown in FIG. 2G. In one embodiment, the portions of the SiN layer 224 which are not covered by the spacers 226 are removed by conventional wet etching method by utilizing phosphoric acid. Consequently, first openings 227 are formed between adjacent projecting portions 215 at this stage. Those skilled in the art will readily observe that the abovementioned stop layer includes, but not limited to, the particular chemical compound of SiN; alternative materials having a relatively higher etching rate than the spacers can be used to substitute SiN as well.

In FIG. 2H, a dielectric layer 228, such as BPSG (Borophosphosilicate glass), LTO (Low Temperature Oxide) or PSG (phosphorus-doped silicate glass), is formed and planarized over the entire MOSFET structure by using conventional techniques, wherein the top surface of the dielectric layer 228 is higher than the top surface of the projecting portions 215. After that, a lithography process is performed to form second openings, which are contact openings 229, between adjacent projecting portions 215 by removing the patterned portions of the dielectric layer 228, the spacers 226 and the insulating layer 214 as shown in FIG. 2I. In one embodiment, the patterned portions of the dielectric layer 228, the spacers 226 and the insulating layer 214 are removed by conventional dry etching or wet etching method. The patterned portions of the dielectric layer 228, the spacers 226 and the insulating layer 214 are removed by utilizing a relatively higher etching selectivity of the dielectric layer 228, the spacers 226 and the insulating layer 214 to the L-type shapes 224a, which means the dielectric layer 228, the spacers 226 and the insulating layer 214 having a relatively higher etching rate than the L-type shapes 224a, and therefore the dielectric layer 228, the spacers 226 and the insulating layer 214 are easier to be etched than the L-type shapes 224a. Consequently, the self-aligned contact openings 229 between adjacent projecting portions 215 are formed at this stage. Those skilled in the art will readily observe that the abovementioned L-type shapes includes, but not limited to, the particular chemical compound of SiN; alternative materials to which the dielectric layer 228, the spacers 226 and the insulating layer 214 have a relatively higher etching rate can be used to substitute SiN as well.

Figure 2J:
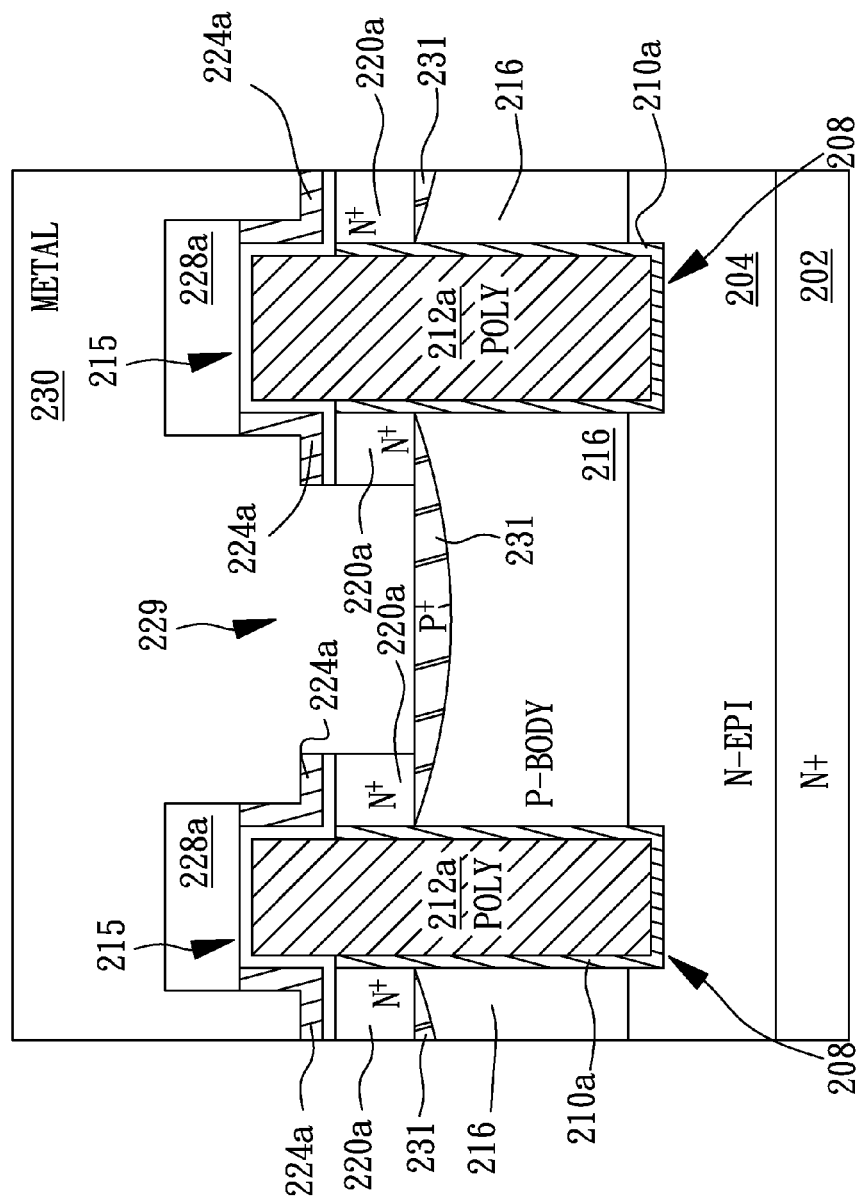

Next, a conventional silicon-etching, such as dry etching or wet etching, is carried out to form source region portions 220a by utilizing a relatively higher etching selectivity of the source regions 220 to the L-type shapes 224a, which means the source regions 220 having a relatively higher etching rate than the L-type shapes 224a, and therefore the source regions 220 are easier to be etched than the L-type shapes 224a. Then, a metal layer 230 is deposited to contact the body regions 216 and the source region portions 220a through the contact openings 229 as shown in FIG. 2J. Before the metal layer 230 is deposited, a layer of heavily doped p-type region 231 is formed along the top surface of the body regions 216 using conventional ion implantation techniques. The heavily doped region 231 helps achieve an ohmic contact between the metal layer 230 and the body regions 216. In one embodiment, without carrying out the silicon-etching, the metal layer 230 is deposited to contact the source regions 220 through the contact openings 229. Those skilled in the art will readily observe that the abovementioned L-type shapes includes, but not limited to, the particular chemical compound of SiN; alternative materials to which the source regions 220 have a relatively higher etching rate can be used to substitute SiN as well.

Figure 3A:
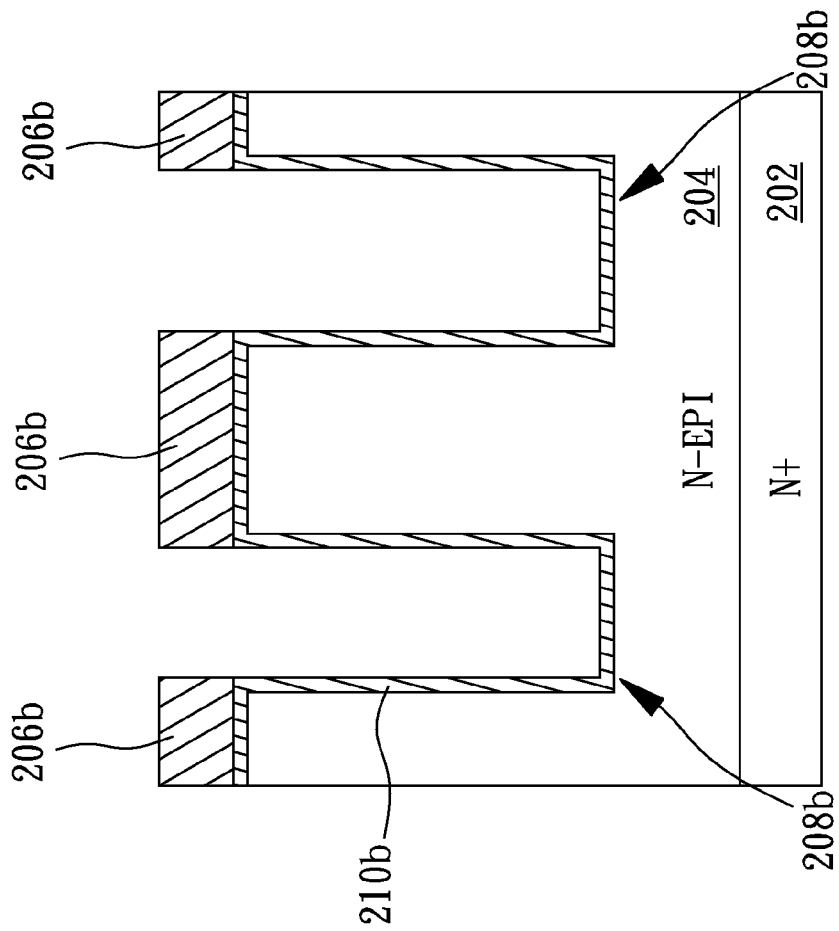
FIG. 3A-3I show cross-section views at different stages of manufacturing a trench MOSFET in accordance with another embodiment of the present invention.

FIGS. 3A-3I are cross-section views at different stages of manufacturing a trench MOSFET in accordance with another embodiment of the present invention. FIG. 3A shows a semiconductor substrate comprising a light doped n-type epitaxial layer 204 extending over a highly doped n-type silicon layer 202, and a SiN/SiO$_2$ composition layer as shown in hard mask regions 206b is used to form a plurality of trenches 208b, wherein a gate dielectric 210b is formed along the inner surface of the trenches 208b.

Figure 3B:
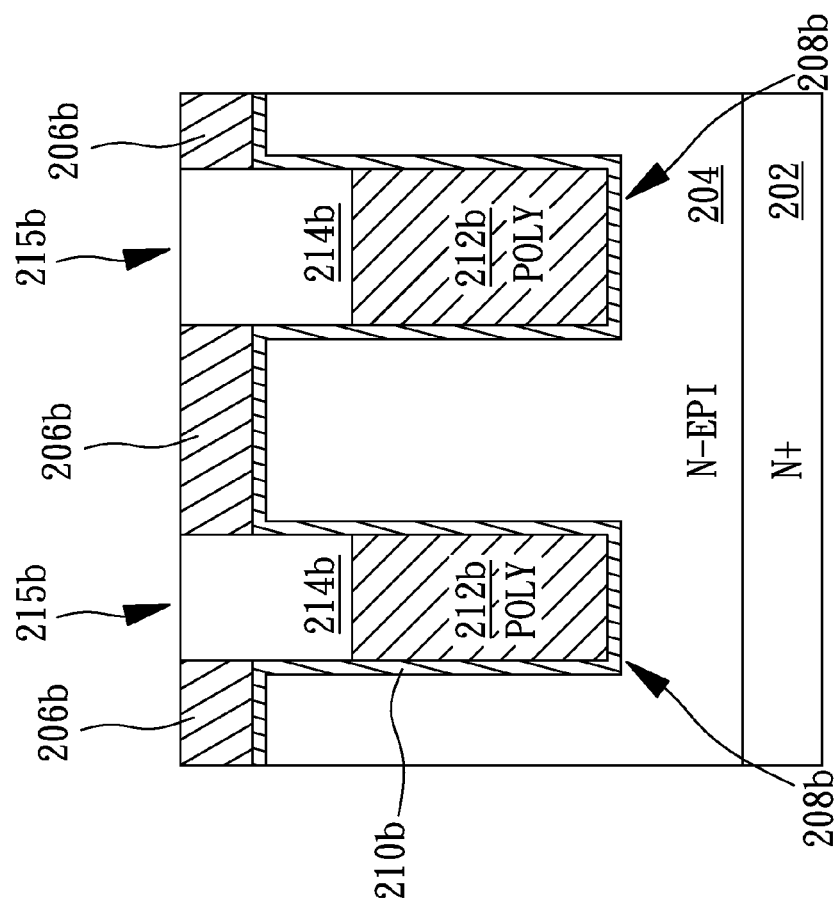

In FIG. 3B, a gate electrode 212b underneath the top surface of the semiconductor substrate is formed in each trench 208b by using conventional methods, wherein each gate electrode 212b is covered by an insulating layer 214b projecting over the top surface of the semiconductor substrate. In one embodiment, the gate electrode 212b is made of poly-silicon and the insulating layer 214b is formed by depositing a dielectric oxide such as LTO (Low Temperature Oxide).

Figure 3C:
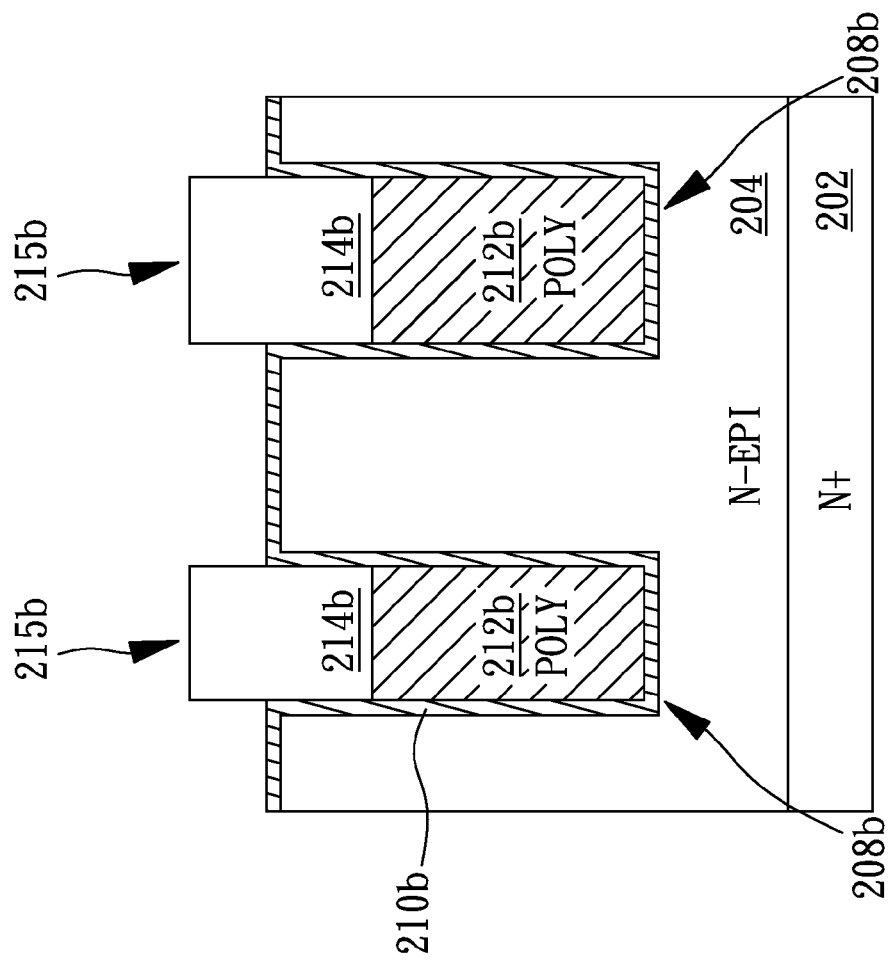

In FIG. 3C, the SiN/SiO$_2$ hard mask regions 206b are removed by using conventional methods. Thereby, each gate electrode 212b covered by the insulating layer 214b and its corresponding gate dielectric 210b along the inner surface of each trench 208b form a trench gate in each trench 208b, wherein each insulating layer 214b thus forms a projecting portion 215b of each trench gate.

Figure 3D:
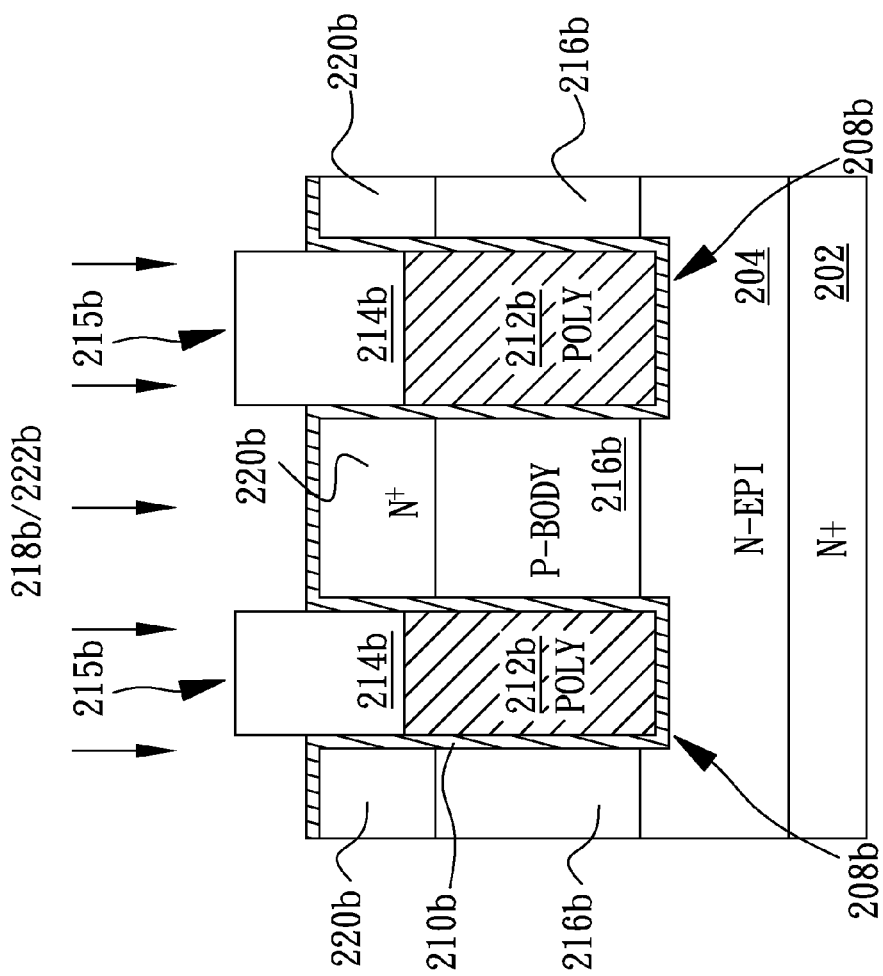

In FIG. 3D, p-type body regions 216b are formed in the epitaxial layer 204 between adjacent trenches 208b by implanting p-type impurities, such as boron, wherein the body regions 216b extend into the epitaxial layer 204 to a depth primarily dictated by the target channel length, and the p-type implanting is symbolically shown by arrows 218b. Afterward, highly-doped n-type source regions 220b are formed in the body regions 216b by implanting n-type impurities such as arsenic or phosphorous, and the highly doped n-type silicon layer 202 is the drain region of the trench MOSFET, wherein the source regions 220b extend along the top surface of the body regions 216b, and the n-type implanting is symbolically shown by arrows 222b. Conventional ion implantation techniques can be used for both implanting steps.

Figure 3E:
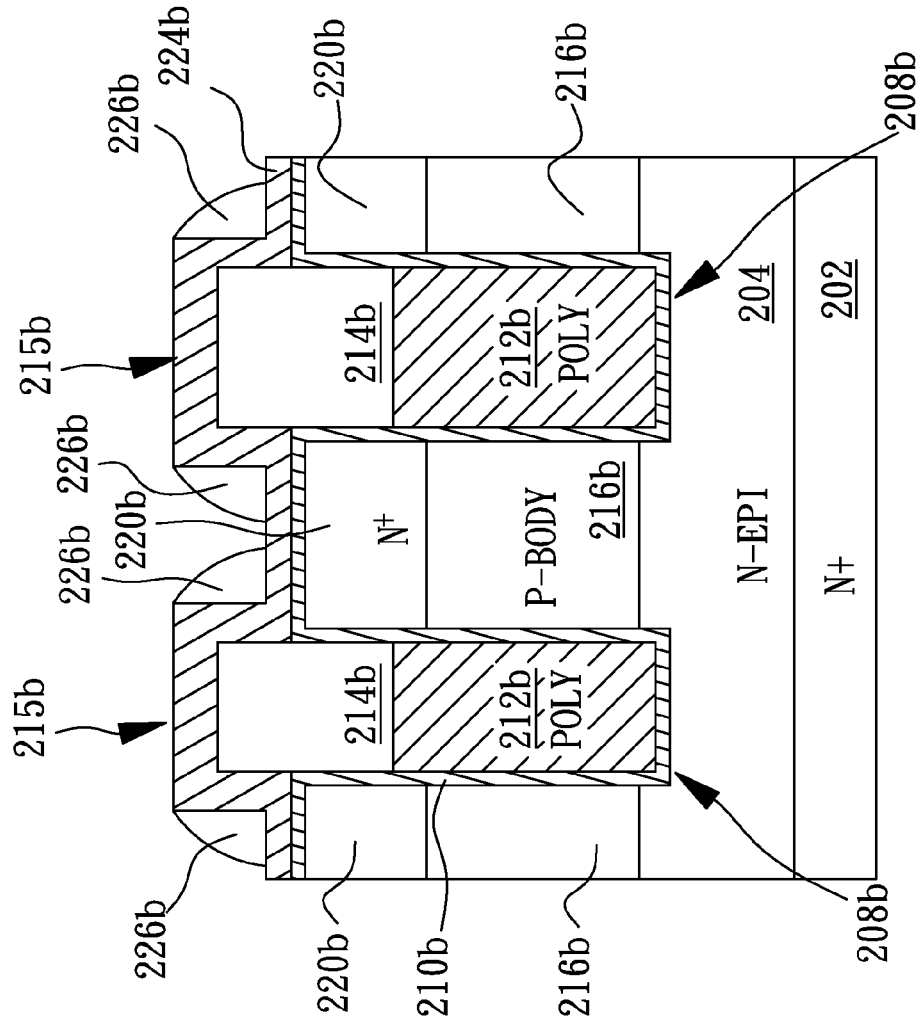
Figure 3F:
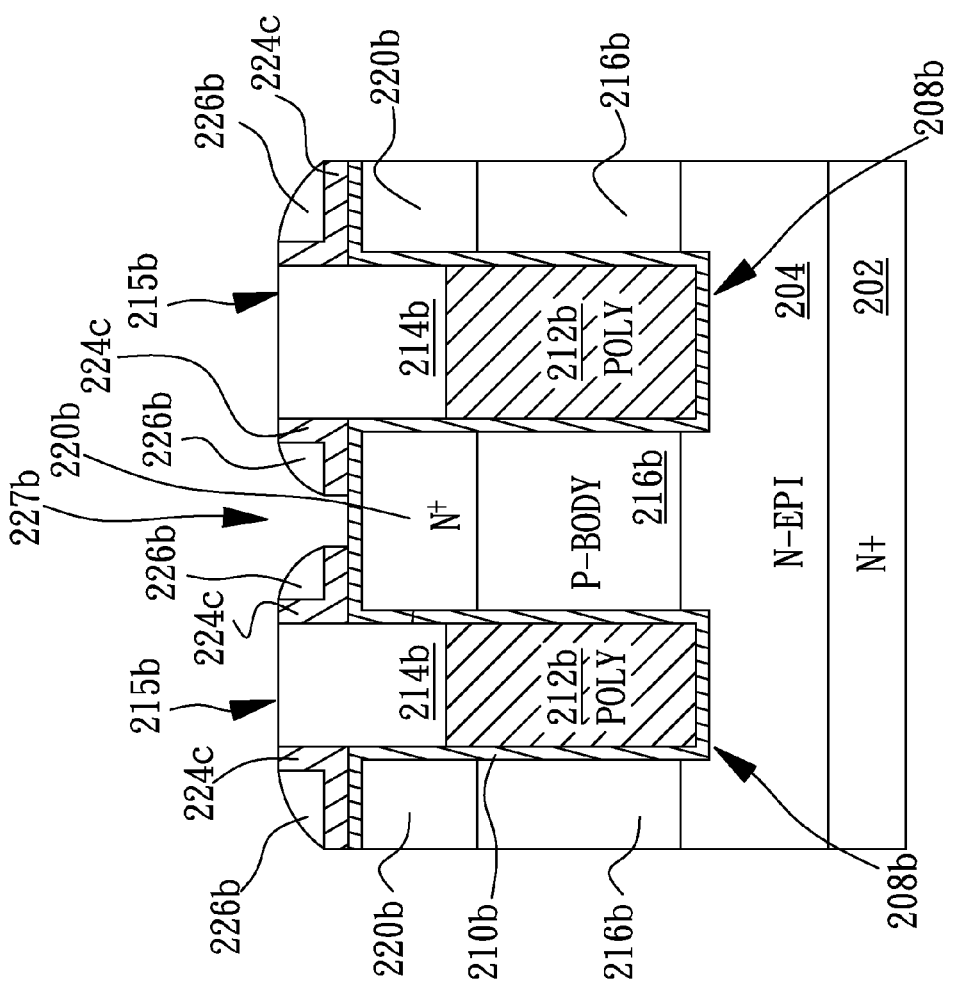

In FIG. 3E, a stop layer, such as a thin SiN (silicon nitride) layer 224b, is formed over the semiconductor substrate and extended over the projecting portions 215b by using conventional methods, for example, conventional deposition techniques. After that, a spacer 226b is formed along each of the sidewalls of the projecting portions 215b. In one embodiment, the spacers 226b are formed by depositing an oxide layer over the entire SiN layer first, and then the oxide layer is etched with a vertical etching, which can be achieved by conventional dry etching method such as reactive ion etching (RIE), so as to leave the spacers 226b, wherein the thickness of the spacers can be controlled by a conventional method. Subsequently, the portions of the SiN layer 224b which are not covered by the spacers 226b are removed by utilizing a relatively higher etching selectivity of the SiN layer 224b to the spacers 226b, which means the SiN layer 224b having a relatively higher etching rate than the spacers 226b, and therefore the SiN layer 224b is easier to be etched than the spacers 226b; and the left portions of the SiN layer 224b which are covered by the spacers 226b thus form an L-type shape 224c along each of the sidewalls of the projecting portions 215b as shown in FIG. 3F. In one embodiment, the portions of the SiN layer 224b which are not covered by the spacers 226b are removed by conventional wet etching method by utilizing phosphoric acid. Consequently, first openings 227b are formed between adjacent projecting portions 215b at this stage. Those skilled in the art will readily observe that the abovementioned stop layer includes, but not limited to, the particular chemical compound of SiN; alternative materials having a relatively higher etching rate than the spacers can be used to substitute SiN as well.

Figure 3G:
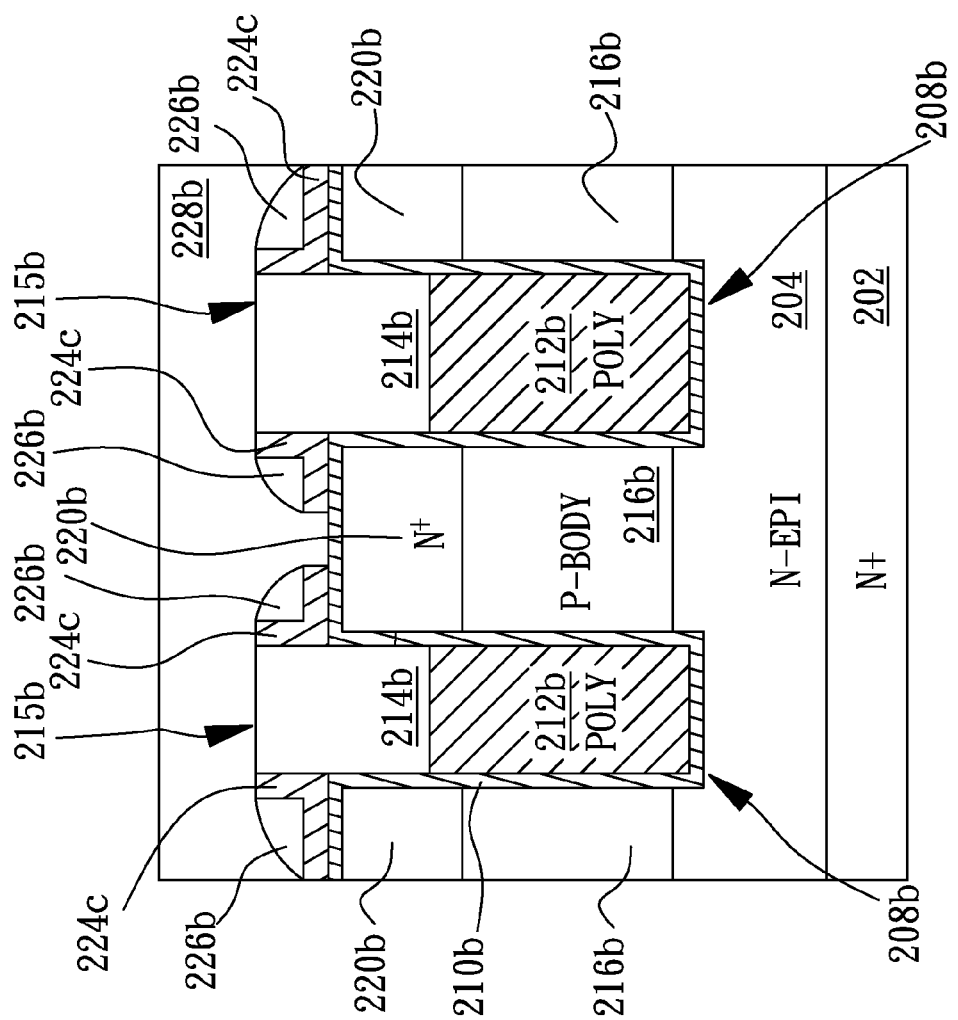
Figure 3H:
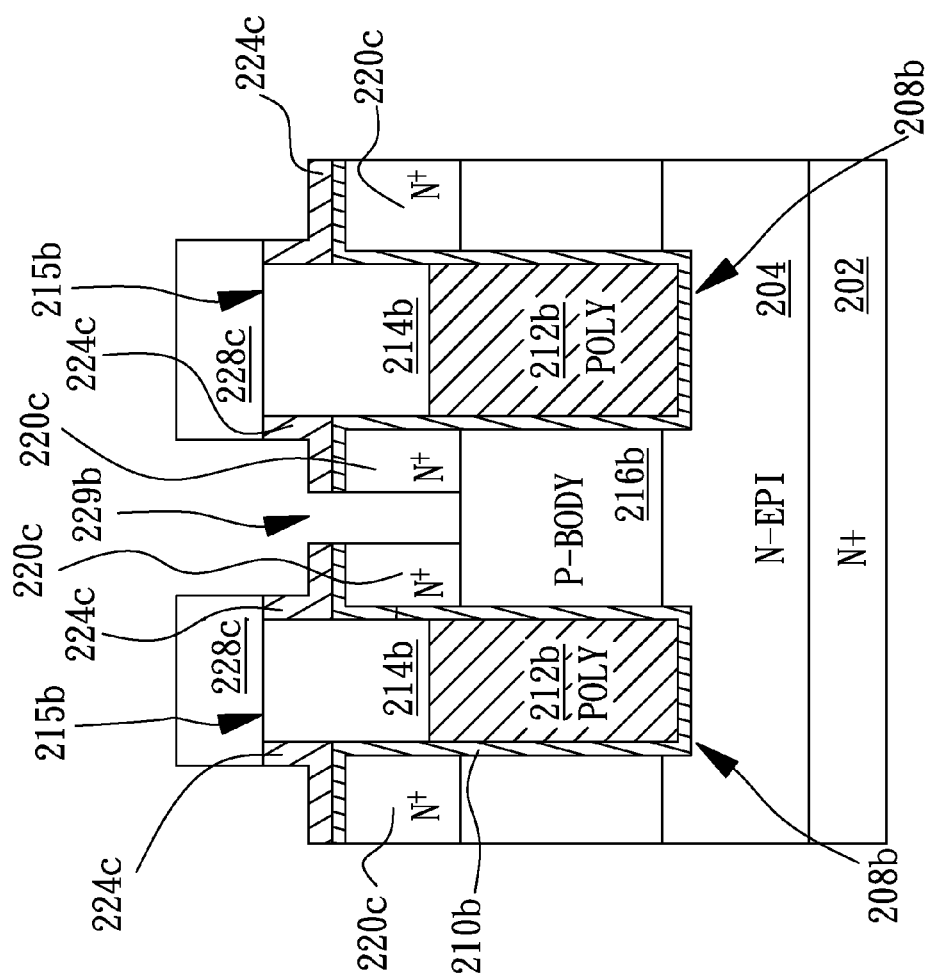

In FIG. 3G, a dielectric layer 228b, such as BPSG (Borophosphosilicate glass), LTO (Low Temperature Oxide) or PSG (phosphorus-doped silicate glass), is formed and planarized over the entire MOSFET structure by using conventional techniques, wherein the top surface of the dielectric layer 228b is higher than the top surface of the projecting portions 215b. After that, a lithography process is performed to form second openings, which are contact openings 229b, between adjacent projecting portions 215b by removing the patterned portions of the dielectric layer 228b, the spacers 226b and the dielectric 210b as shown in FIG. 3H. In one embodiment, the patterned portions of the dielectric layer 228b, the spacers 226b and the dielectric 210b are removed by conventional dry etching or wet etching method. The patterned portions of the dielectric layer 228b, the spacers 226b and the dielectric 210b are removed by utilizing a relatively higher etching selectivity of the dielectric layer 228b, the spacers 226b and the dielectric 210b to the L-type shapes 224c, which means the dielectric layer 228b, the spacers 226b and the dielectric 210b having a relatively higher etching rate than the L-type shapes 224c, and therefore the dielectric layer 228b, the spacers 226b and the dielectric 210b are easier to be etched than the L-type shapes 224c. Consequently, the self-aligned contact openings 229b between adjacent projecting portions 215b are formed at this stage. Those skilled in the art will readily observe that the abovementioned L-type shapes includes, but not limited to, the particular chemical compound of SiN; alternative materials to which the dielectric layer 228b, the spacers 226b and the dielectric 210b have a relatively higher etching rate can be used to substitute SiN as well.

Figure 3I:
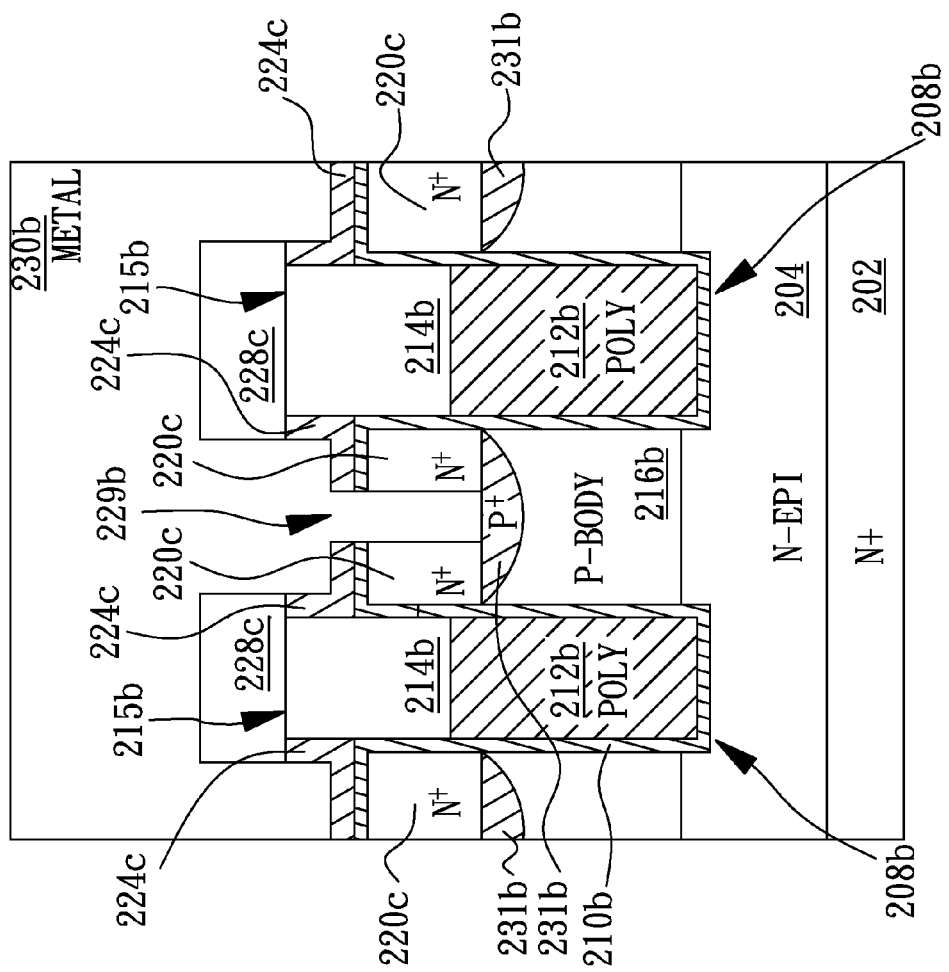

Next, a conventional silicon-etching, such as dry etching or wet etching, is carried out to form source region portions 220c by utilizing a relatively higher etching selectivity of the source regions 220b to the L-type shapes 224c, which means the source regions 220b having a relatively higher etching rate than the L-type shapes 224c, and the source regions 220b are easier to be etched than the L-type shapes 224c. Then, a metal layer 230b is deposited to contact the body regions 216b and the source region portions 220c through the contact openings 229b as shown in FIG. 3I. Before the metal layer 230b is deposited, a layer of heavily doped p-type region 231b is formed along the top surface of the body regions 216b using conventional ion implantation techniques. The heavily doped region 231b helps achieve an ohmic contact between the metal layer 230b and the body regions 216b. In one embodiment, without carrying out the silicon-etching, the metal layer 230b is deposited to contact the source regions 220b through the contact openings 229b. Those skilled in the art will readily observe that the abovementioned L-type shapes includes, but not limited to, the particular chemical compound of SiN; alternative materials to which the source regions 220b have a relatively higher etching rate can be used to substitute SiN as well.

Figure 4:
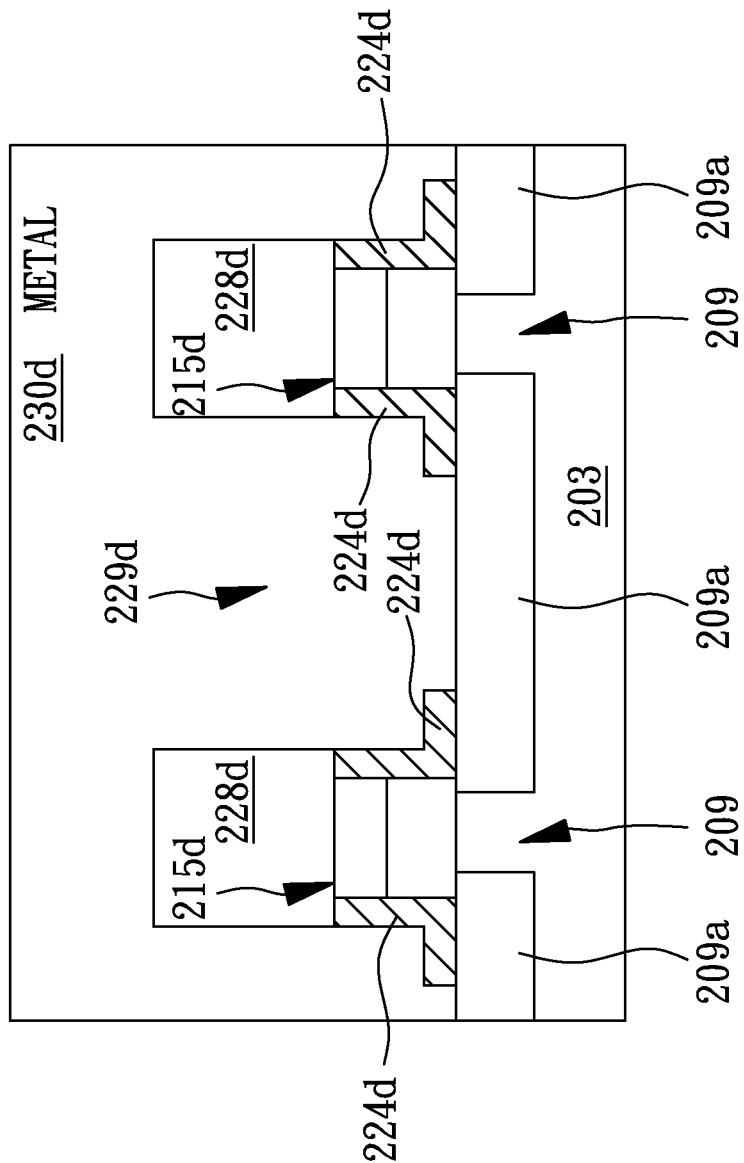
FIG. 4 shows a cross-section view of other type MOSFET structure with contact openings formed according to yet another embodiment of the present invention.

In yet another embodiment, the present invention can be applied to a general MOSFET structure for forming a self-aligned contact opening of which the dimension can be controlled precisely as shown in FIG. 4. An L-type shape 224d is formed by above-mentioned method on each of the sidewalls of the transistors 209 which are fabricated on a semiconductor substrate 203, wherein the portion with a height relative to the semiconductor substrate 203 in each transistor 209 is regarded as a projecting portion 215d, and therefore the metal layer 230d can contact the source/drain regions 209a through the contact openings 229d which are self-aligned to adjacent transistors 209 by the L-type shapes 224d.

Figure 1:
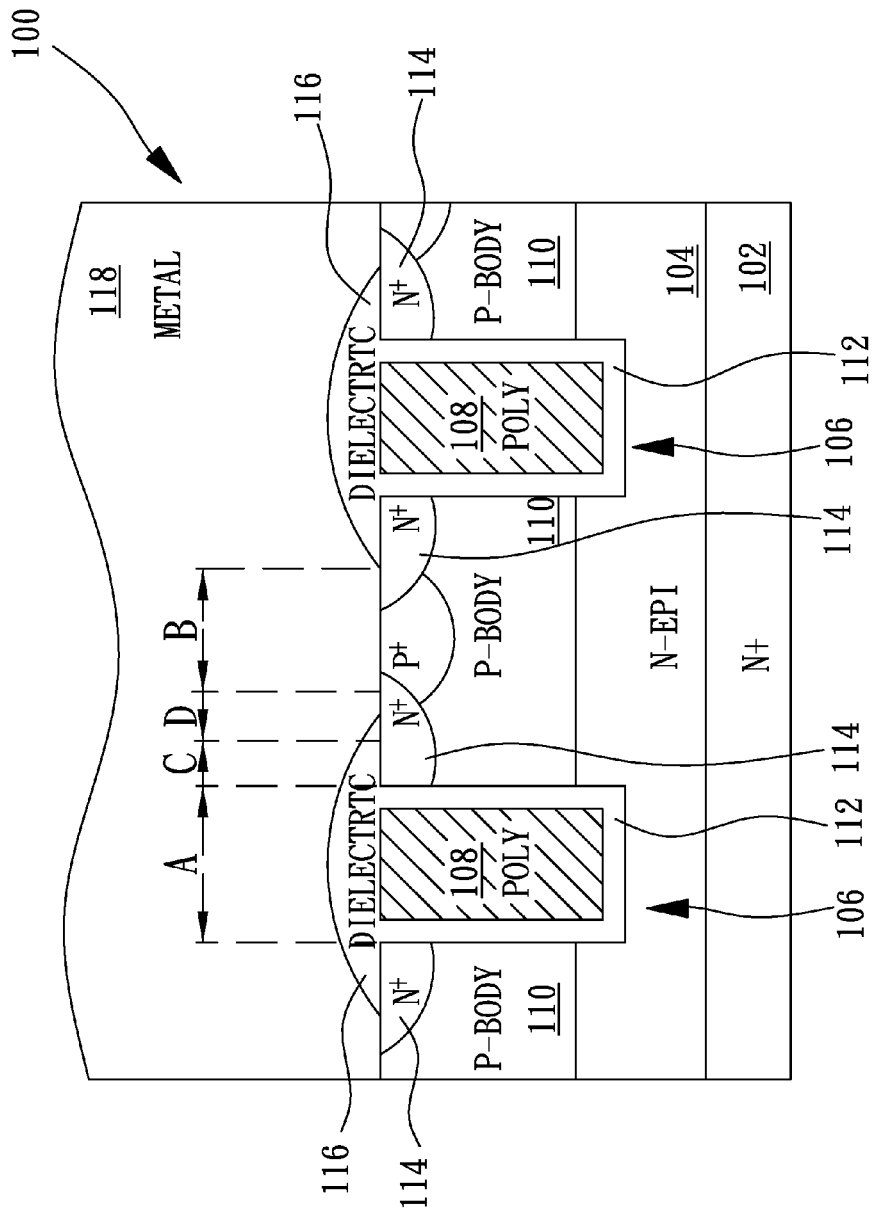
FIG. 1 shows a cross-section view of a conventional trench MOSFET.

Because the source region portions 220a and the contact openings 229 are self-aligned to adjacent trenches 208, the contact alignment is defined very precisely, and the contact misalignment (dimension D in FIG. 1) is eliminated. Moreover, the contact opening (dimension B in FIG. 1) can be made smaller than the minimum critical dimension that the lithography tools can achieve, and the trench-to-contact spacing (dimension C in FIG. 1) will be maintained precisely as well. Thus, not only the 2D term is eliminated from the minimum cell pitch A+B+2C+2D of the conventional trench MOSFET in FIG. 1, but also the term B can be made much smaller. For the same process technology, a much smaller cell pitch is therefore obtained without increasing the process complexity. In addition, due to the smaller contact opening dimension than the minimum critical dimension that the lithography tools can achieve, it makes easier for the lithography process to align the contact opening, and hence reduces the cost of manufacturing process. For example, if a 0.25 μm contact opening is desired, a larger critical dimension of mask size such as 0.3 μm or 0.4 μm can be used in the lithography process to achieve a 0.25 μm contact opening by using the method presented in this invention to reduce the cost.

Please refer back to FIG. 2I. As shown in FIG. 2I, the L-type shapes advantageously define the contact openings 229 between adjacent projecting portions 215, in which the contact opening dimension and the contact alignment can be defined by controlling the thickness of the SiN layer 224, which is in a range of 200 angstrom to 2000 angstrom. Thus, the source region portions 220a and the contact openings 229 which are self-aligned to adjacent trenches 208 are formed, and the contact opening dimension can be shrunk and precisely-controlled to reduce parasitic capacitance effects so that the threshold voltage of MOSFET can be controlled more accurately; moreover, the present invention is suitable to be applied to many of the manufacturing process application for forming an opening on a semiconductor substrate having two projecting portions without increasing the process complexity, wherein the opening dimension can be precisely-controlled.

Moreover, referring back to FIG. 2H, the etching selectivity between the dielectric layer 228 and the L-type shapes 224a which are made of SiN is in a range of 10:1 to 20:1, and the higher etching selectivity is utilized, the more accurately the contact opening dimension can be controlled. Therefore, the contact opening dimension will be controlled more accurately by utilizing a higher etching selectivity when forming the contact openings 229.

While the above is a complete description of the embodiments of the present invention, it is possible to use various alternatives, modifications and equivalents. For example, the process steps depicted in FIGS. 2B-2J and FIGS. 3A-3I are for manufacturing an N-channel MOSFET. Modifying these process steps to obtain an equivalent P-channel MOSFET would be obvious to one skilled in the art in light of the above teachings.

Also, the body regions can be formed earlier in the processing sequence. For example, in FIG. 2B, prior to forming the hard mask regions 206, p-type impurities may be implanted into the epitaxial layer 204 or a p-type epitaxial layer can be grown over the epitaxial layer 204. Similarly, the source regions can be formed earlier in the processing sequence. For example, a blanket implanting of n-type impurities may be carried out to form a highly-doped n-type region in the body region before forming the trenches.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a MOSFET, comprising the steps of:
    a1. forming a first trench gate in a semiconductor substrate of a first conductive type, wherein the first trench gate comprises a first projecting portion higher than the top surface of the semiconductor substrate, wherein the first projecting portion has a first sidewall and a second sidewall;
    a2. forming a second trench gate in the semiconductor substrate, wherein the second trench gate comprises a second projecting portion higher than the top surface of the semiconductor substrate, wherein the second projecting portion has a third sidewall and a fourth sidewall, wherein the second sidewall and the third sidewall are between the first sidewall and the fourth sidewall;
    a3. forming a first contact opening between the first projecting portion and the second projecting portion, comprising the steps of:
        a. forming a first layer over the semiconductor substrate, extending over the first projecting portion and the second projecting portion;
        b. forming a first spacer along the second sidewall and a second spacer along the third sidewall; and
        c. forming the first contact opening on the semiconductor substrate between the first projecting portion and the second projecting portion by removing the portion of the first layer between the first spacer and the second spacer, wherein the remaining portion of the first layer along the second sidewall forms a first L-type shape, and the remaining portion the first layer along the third sidewall forms a second L-type shape;
    a4. implanting first impurities of a second conductivity type to form a body region between the trench gates in the semiconductor substrate, wherein the second conductive type is opposite to the first conductive type;
    a5. implanting second impurities of a third conductivity type to form a source region over the body region between the trench gates in the semiconductor substrate, wherein the third conductive type is opposite to the second conductive type; and
    a6. forming a trench in the source region through the first contact opening to separate the source region into two disjoint portions, wherein the bottom of the trench is formed by the body region and is substantially aligned with the bottom of the source region by utilizing a relatively higher etching selectivity of the source region to the L-type shapes.

2. The method according to claim 1, wherein the step b comprises the sub-steps of:
    b1. forming an oxide layer over the first layer; and
    b2. anisotropically etching the oxide layer to remove the portions of the oxide layer which are not along either the second sidewall or the third sidewall to form the first spacer along the second sidewall and the second spacer along the third sidewall.

3. The method according to claim 2, wherein removing the portions of the oxide layer which are not along either the second sidewall or the third sidewall in step b2 is by dry etching or wet etching.

4. The method according to claim 3, wherein removing the portion of the first layer between the first spacer and the second spacer in step c is by dry etching or wet etching, wherein the first layer has a relatively higher etching rate than the spacers.

5. The method according to claim 4, further comprising sub-steps after step a5 to form a second contact opening, the sub-steps comprising:
    a51. forming a second layer over the semiconductor substrate extending over the first projecting portion, the second projecting portion, the first spacer and the second spacer; and
    a52. forming the second contact opening in the second layer between the first projecting portion and the second projecting portion by removing a predefined portion of the second layer, the first spacer and the second spacer, wherein the second contact opening is larger than the first contact opening.

6. The method according to claim 5, wherein removing the predefined portion of the second layer, the first spacer and the second spacer in step a52 is by dry etching or wet etching, wherein the second layer and the spacers have a relatively higher etching rate than the first layer.

7. The method according to claim 1, wherein the second conductive type is n-type, and the first and the third conductive types are p-type.

8. The method according to claim 1, wherein the second conductive type is p-type, and the first and the third conductive types are n-type.

9. The method according to claim 1, wherein the first layer is made of SiN (silicon nitride).

10. The method according to claim 5, wherein the second layer is an insulating layer.

11. The method according to claim 10, wherein the insulating layer is BPSG, PSG or LTO, which comprises oxide.

* * * * *